(12) United States Patent
Peters (10) Patent No.: US 6,249,840 B1
(45) Date of Patent: Jun. 19, 2001

(54) MULTI-BANK ESDRAM WITH CROSS-COUPLED SRAM CACHE REGISTERS

(75) Inventor: Michael Peters, Colorado Springs, CO (US)

(73) Assignee: Enhanced Memory Systems, Inc., Colorado Springs, CO (US)

(*) Notice: Subject to any disclaimer, the term of this patent is extended or adjusted under 35 U.S.C. 154(b) by 0 days.

(21) Appl. No.: 09/178,298

(22) Filed: Oct. 23, 1998

(51) Int. Cl.[7] ............................................. G06F 12/00
(52) U.S. Cl. ............................................. 711/105
(58) Field of Search ........................... 711/3, 5, 104, 711/105

(56) References Cited

U.S. PATENT DOCUMENTS

| | | | | |
|---|---|---|---|---|
| 4,541,075 | * | 9/1985 | Dill et al. | 365/189 |
| 4,577,293 | * | 3/1986 | Matick et al. | 365/189 |
| 4,649,516 | * | 3/1987 | Chung et al. | 364/900 |
| 5,421,000 | * | 5/1995 | Fortino et al. | 395/425 |
| 5,953,738 | * | 9/1999 | Rao | 711/105 |
| 5,963,481 | * | 10/1999 | Alwais et al. | 365/189.04 |
| 6,072,741 | * | 6/2000 | Taylor | 365/219 |

* cited by examiner

Primary Examiner—Kevin Verbrugge
(74) Attorney, Agent, or Firm—Hogan & Hartson, LLP (57) ABSTRACT

A multi-bank ESDRAM, and an associated method, provides for the caching of data accessed from any DRAM memory array of the multi-bank ESDRAM device to any SRAM cache register of the ESDRAM device. Execution of a read operation is carried out using an existing command set utilized to read data from conventional ESDRAM devices.

20 Claims, 7 Drawing Sheets

MULTI-BANK ESDRAM WITH CROSS-COUPLED SRAM CACHE REGISTERS

The present invention relates generally to integrated circuit memory devices. More particularly the present invention relates to a memory device, and an associated method, having a DRAM (dynamic random access memory) memory portion and at least two SRAM (static random access memory) cache registers in which data stored at selected rows of the DRAM memory array can be cached as a result of a read command.

In an exemplary implementation, the invention is embodied in a multi-bank ESDRAM (enhanced synchronous dynamic random access memory) having a plurality of DRAM banks and a plurality of SRAM cache registers. The SRAM cache registers are able to store data retrieved from any of the DRAM banks of any ESDRAM of the multi-bank ESDRAM during a read page operation and thereafter burst the data onto a data bus. The read page operation from any of the DRAM banks to any of the SRAM cache registers is effectuated utilizing an already-existing SRAM command set.

Pages of data stored at a single DRAM bank can be cached at any of the SRAM cache registers. By permitting more than one SRAM cache register to be associated with a single DRAM bank, data read from a single DRAM bank during successive read operations need not overwrite data previously read from the DRAM bank to a single SRAM cache register.

BACKGROUND OF THE INVENTION

Advancements in digital technologies have permitted the development and implementation of many new products. Products pertaining to, and including, digital processing circuitry are exemplary of products possible as a result of such advancements.

Repetitive functions can be carried out by digital processing circuitry at rates significantly more rapidly than the manual performance of such functions. The rapid rates at which the digital processing circuitry is able to repeatedly perform such functions have permitted activities previously considered impractical, to be readily implementable.

During the effectuation of functions by the operation of digital processing circuitry, data is sometimes read from, and written to, memory locations of a memory device. For instance, a digital computer system includes a central processing unit and a computer main memory. The computer main memory provides storage locations to which to write data, and from which to read data. Asynchronous DRAM (dynamic random access memory) integrated circuit devices are sometimes used to form the computer main memory. DRAM devices provide a relatively inexpensive memory at which to store relatively large amounts of data. SRAM (static random access memory) integrated circuit devices sometimes also form the computer main memory, or portions thereof. Relatively quick access is permitted to the memory locations of an SRAM integrated circuit device as a high-speed, locally-accessed copy of the memory available to the central processing unit of the computer system. However, SRAM devices are relatively more costly than DRAM devices.

An ESDRAM (enhanced synchronous dynamic random access memory) is formed of both a DRAM component portion and an SRAM component portion. Because of the dual nature of an ESDRAM, an ESDRAM provides the advantages of a DRAM memory device and also the advantages of an SRAM device. Namely, the cost advantages of a DRAM are provided by the DRAM component portion of the ESDRAM, and the speed advantages of the SRAM are provided by the SRAM component portion of the ESDRAM. The SRAM component portion of an ESDRAM provides a cache at which a row, also called a "page", can be stored during execution of a read or write operation. Multi-bank ESDRAM memory devices are available having multiple numbers of DRAM banks, each having an associated SRAM cache, at which digital data can be written and read.

In conventional multi-bank ESDRAM devices, a particular SRAM cache is associated with a particular DRAM memory bank. When data is to be read from, or written to, a particular row of a selected DRAM memory bank, the data is conventionally cached in the SRAM cache associated with the DRAM bank in a direct mapping operation. Because of the speed advantages associated with SRAM devices, if a manner could be provided by which to associate more than one SRAM device with a single DRAM memory array, improved memory retrieval times would be possible. If, in a multi-bank, ESDRAM device, for instance a manner could be provided by which to permit access between a single DRAM bank and the SRAM caches associated with other DRAM banks of the multi-bank device, improved rates of data retrieval operations would be possible.

It is in light of this background material related to integrated circuit memory devices that the significant improvements of the present invention have evolved.

SUMMARY OF THE INVENTION

The present invention, accordingly, advantageously provides a memory device, and an associated method, having at least one DRAM memory array and at least two SRAM registers. Data stored in selected rows of the DRAM memory array can be cached in any of the SRAM registers during a read operation.

In one aspect of the present invention, pages of data stored at a single DRAM bank are retrieved during execution of a read operation and cached in any selected SRAM cache register. Selection to which of the SRAM caches the data is provided pursuant to a read operation is made utilizing an already-existing command set.

In one implementation, a multi-bank ESDRAM is provided. The multi-bank ESDRAM includes a plurality of, i.e., an N-number of DRAM banks and a plurality of, i.e., an N-number of, SRAM cache registers. The SRAM cache registers are able to store data retrieved from any of the DRAM banks of any ESDRAM of the multi-bank ESDRAM during a read page operation. Pages of data read during a read operation are thereby capable of being cached in any of the N-number of cache registers from any of N-number DRAM banks of the multi-bank device. Because the already-existing SRAM command set is utilized to effectuate the read operation, a separate command set is not required to accomplish the associativity. In the exemplary implementation, a bus is provided for interconnecting the SRAM cache registers of the respective ESDRAM devices to provide the pages of data to any selected SRAM cache register.

In these and other aspects, therefore, a memory device, and an associated method, is provided for storing indications of digital data therein. A first DRAM bank is formed of rows and columns of DRAM memory locations and defines a first memory array. A first SRAM register is formed of at least a row of SRAM memory locations capable of caching data of at least a portion of a selected row of the DRAM memory locations of the first DRAM bank responsive to a read command to read the data of the portion of the selected row of the DRAM memory locations of the first DRAM bank to the first SRAM register. A second SRAM register is also formed of at least a row of SRAM memory locations and is also capable of caching data of at least a portion of a selected row of the DRAM memory locations of the first DRAM. Data cached at the second SRAM is responsive to a read command to read the data of the portion of the selected row of the DRAM memory locations of the first DRAM bank to the second SRAM register.

A more complete appreciation of the present invention and to the scope thereof can be obtained from the accompanying drawings which are briefly summarized below.

DETAILED DESCRIPTION

Figure 1:
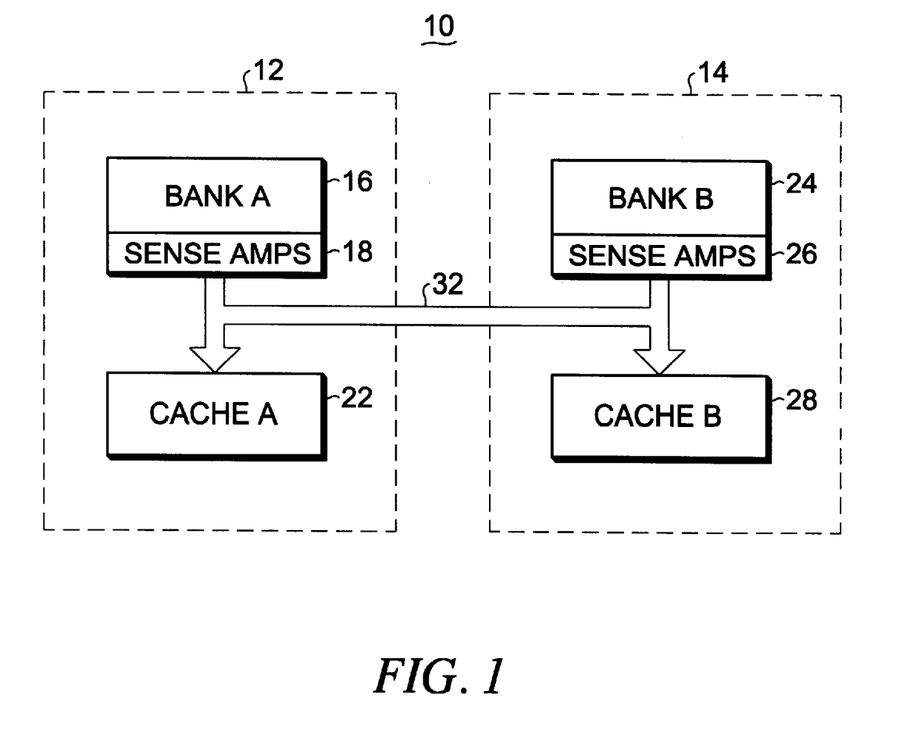
FIG. 1 illustrates a functional block diagram of a memory device of an embodiment of the present invention.

Referring first to FIG. 1, a memory device, shown generally at 10, is operable to store digital data during operations thereof. Digital data is storable at the memory device 10 pursuant to a write operation, and digital data, once stored at the memory device, is retrievable pursuant to a read operation. The memory device 10 is here shown to be formed of a first ESDRAM (enhanced synchronous dynamic random access memory) 12 and at least a second ESDRAM 14. The memory device 10 is exemplary and, in other implementations, the memory device 10 includes additional numbers of ESDRAMs similar to the ESDRAMs 12 and 14. And, in other implementations, the memory device 10 is formed of other elements.

The first ESDRAM 12 includes a DRAM (dynamic random access memory) memory array 16 formed of rows and columns of memory locations which together form a memory array. A single row, labeled "x", of the array is represented in the Figure. In conventional manner, data stored in the memory locations of a single row of the memory array is sometimes referred to as a page of data. A page of data is written to a row of the memory array formed of the DRAM 16 during a write operation, and a page of data stored at a row of the memory array is analogously retrievable therefrom during a read operation.

Sense amplifiers 18 are associated with the memory array of the DRAM 16. The sense amplifiers 18 are operable to sense charge stored in the memory cells forming the memory locations of a row of the memory array of the DRAM 16. Responsive to the sensed charge, the sense amplifiers 18 develop binary bit patterns.

The ESDRAM 12 further includes an SRAM (static random access memory) cache register 22. The cache register 22 is coupled to the sense amplifiers 18, selectively to receive the bit patterns formed at the amplifiers 18 during a read operation from a row of the memory array of the DRAM 16 to the register 22.

The ESDRAM 14 is analogously constructed. That is to say, the ESDRAM 14 also includes a DRAM, here a DRAM 24 having rows and columns of memory locations forming a memory array. The DRAM 24 is coupled to sense amplifiers 26 capable of sensing the contents of the memory cells forming the memory locations of the DRAM 24 and for developing the binary bit patterns responsive to the sensed values. The sense amplifiers 26 are further coupled to an SRAM cache register 28 capable of caching a row of data, such as a page of data retrieved from a row of the DRAM 24.

The memory device 10 further includes a bus, here the bus 32, extending between the amplifiers 18 of the ESDRAM 12 and the register 28 of the ESDRAM 14. The bus 32 provides a path upon which data sensed by the sense amplifiers 18 can be stored at the register 28 rather than the register 22. Analogously, also, bit patterns formed at the sense amplifiers 26 are also storable at the cache register 22 by way of the same bus.

Because bit patterns developed by a sense amplifier, such as the sense amplifier 18 can be provided to either of the registers 22 or 28, execution of a read operation can cache the page of data in either of the registers. Successive read operations of rows of a single DRAM, such as the DRAM 16 can be effectuated, for instance, by reading a first page of data to the register 22 and thereafter by way of reading the subsequent page of data to the register 28. Successive read operations to successive registers can be effectuated more quickly than by successively reading the pages of data to a single register.

Figure 2:
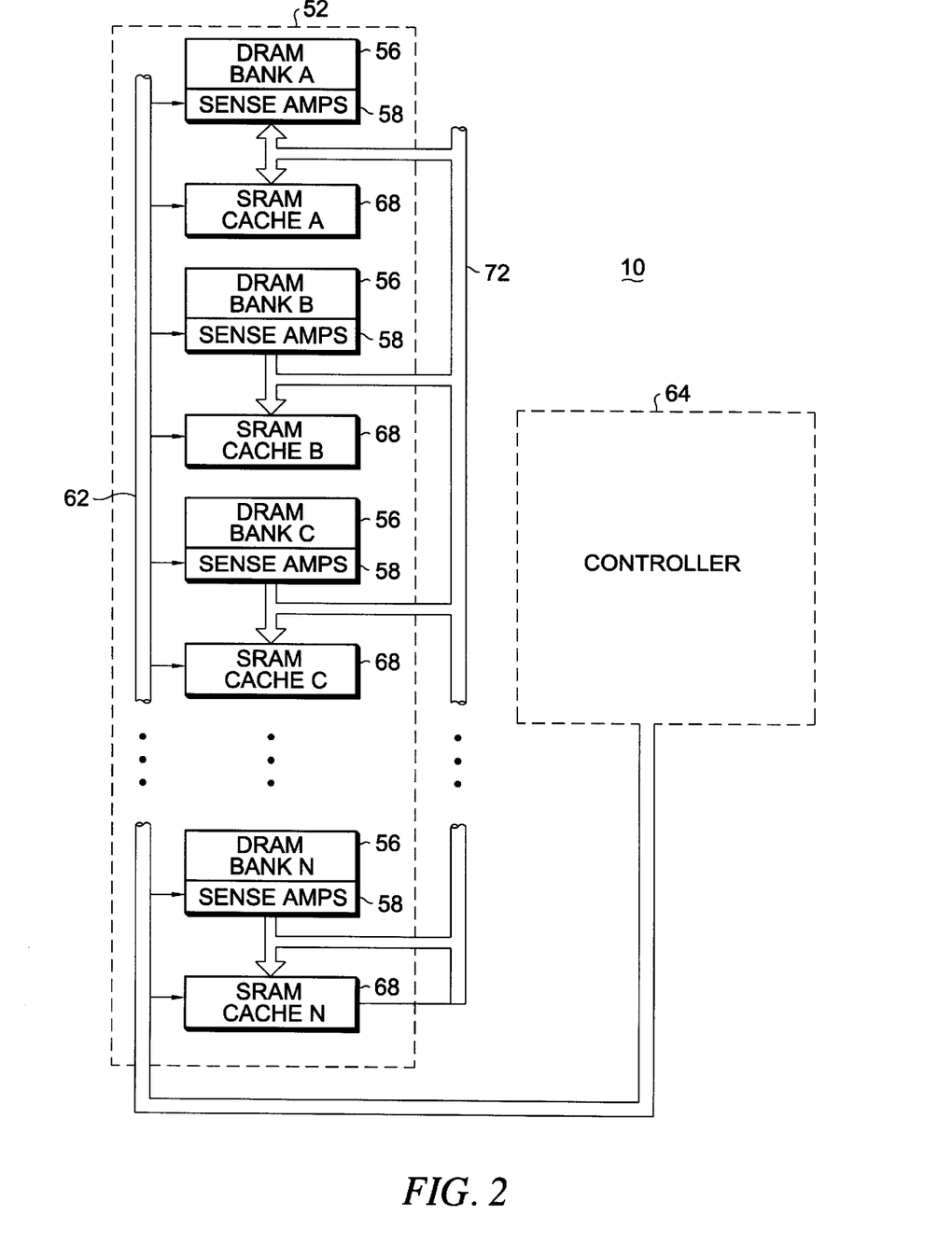
FIG. 2 illustrates a multi-bank ESDRAM device of an embodiment of the present invention.

FIG. 2 illustrates a memory device 10 of another embodiment of the present invention. The memory device 10 is here shown to include a multi-bank ESDRAM assembly 52 having N DRAM banks 56, here numbered A–N. Each of the DRAM banks 56 is formed of rows and columns of memory locations, together defining memory arrays. Sense amplifiers 58 are associated with each of the DRAM banks 56. The sense amplifiers 58 are operable to develop bit patterns responsive to sensed charges of the memory locations of accessed rows of the DRAM banks to which the respective sense amplifiers 58 are associated. Control lines 62 coupled to a controller 64 control operation of the sense amplifiers 58. Control signals generated on the lines 62 are operable to cause the effectuation of, e.g., a read operation to read data stored at selected rows of selected ones of the DRAM banks 56.

The multi-bank ESDRAM assembly 52 further includes a plurality of SRAM cache registers, here numbered A–N. Each of the cache registers 68 is coupled to the sense amplifiers 58 of every of the DRAM banks 56 by way of the bus 72. Because the bus 72 connects all of the sense amplifiers 58 to all of the cache registers 68, a page of data read from any row of the DRAM banks 56 and cached at any of the cache registers 68. Control signals generated on, e.g., the lines 62 cause selected rows from selected DRAM banks 56 to be sensed by appropriate ones of the sense amplifiers 58, thereafter to be cached at appropriate cache registers 68.

Figures 3, 3A:
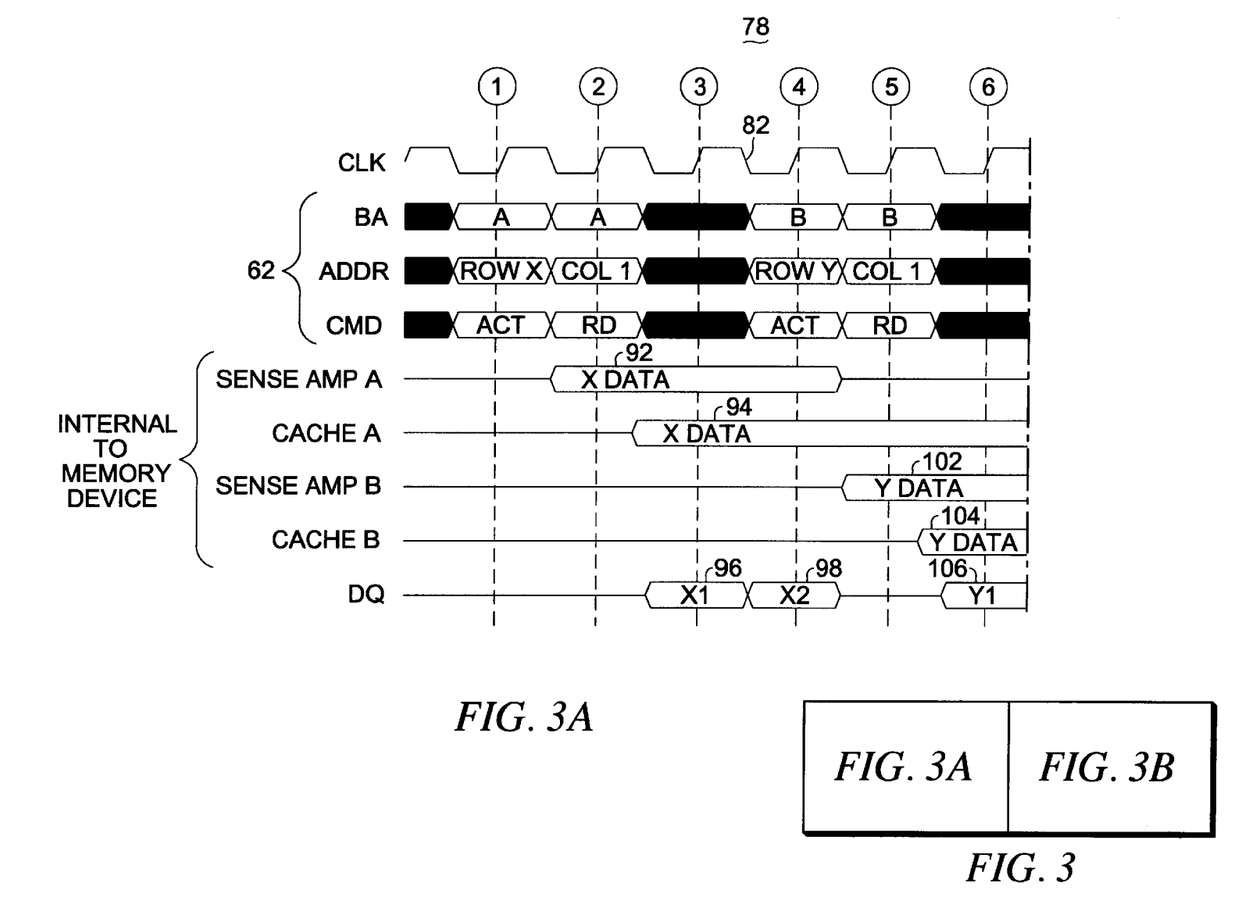
FIGS. 3A and 3B illustrate a timing diagram representing exemplary signaling responsive to which data is retrieved during operation of an embodiment of the present invention.
Figure 3B:
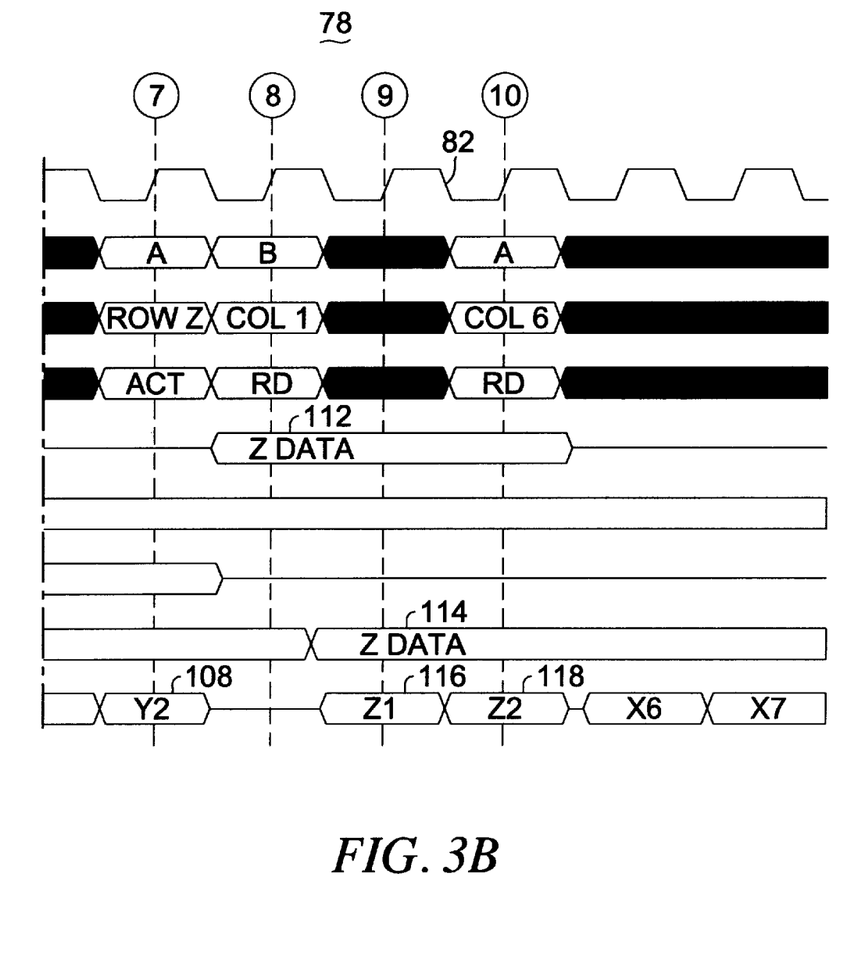

FIGS. 3A and 3B illustrate a timing diagram, shown generally at 78, showing signaling generated during exemplary operation of the memory device 10 shown in FIG. 2. In the exemplary illustration, operation of the memory device 10 is triggered by leading edges of a clock pulse 82 which drives operation of the memory device. The control lines 62 include a bank address bus BA, an address bus, Addr, and a command bus, CMD.

Signals generated on the BA bus are determinative of which bank is addressed and to which cache register a page of data is cached. Signals generated on the Addr bus are determinative of which rows and columns of a DRAM bank are accessed. And, signals generated on the CMD bus identify the command which is to be executed, such as a read command.

At the leading edges of the first two clock pulses of the pulse train 82, the $x^{th}$ row of DRAM bank A is accessed, and the first column of data contained therein is read to the cache register A, identified during the second clock pulse.

Responsive to the addressing of the $x^{th}$ row during the first clock pulse, the sense amplifiers 58 identify a bit pattern representative of the charges stored at the $x^{th}$ row of the selected DRAM bank. Thereafter, and responsive to the cache register identified during the second clock pulse, such data is cached in the selected cache register, as indicated by the data line 94. The first two columns x1 and x2, of the $x^{th}$ row of data is then bursted upon a DQ bus (a JEDEC-defined bus), as indicated by the data lines 96 and 98.

During clock pulses four and five, the $y^{th}$ row of the DRAM bank B is accessed, and the data is cached at the cache register B. The data line 102 represents the formation of the bit pattern at the sense amplifiers associated with the DRAM bank one representative of the $y^{th}$ row of data of the DRAM bank B, and the data line 104 represents the caching of the data at the cache register B. Thereafter, and as indicated by the data lines 106 and 108, the first two columns, y1 and y2, of the $y^{th}$ row of data is bursted onto the DQ bus.

At clock pulses seven and eight, control signals generated on the lines 62 cause the $z^{th}$ row of the DRAM A to be cached at the cache register B. That is to say, data stored at one DRAM bank is caused to be cached at a cache register associated with another of the DRAM banks. As illustrated, responsive to the seventh clock pulse, the $z^{th}$ row of the DRAM bank A is accessed, and the sense amplifiers associated with the DRAM bank A form bit patterns representative of the data stored thereat, indicated in the Figures by the data lines 112. And, during the eighth clock pulse, the data sensed by the sense amplifier A is cached at the cache register B, indicated by the data lines 114. Thereafter, and as indicated by the data lines 116 and 118, the first two columns of the $z^{th}$ row of the DRAM bank A is bursted upon the DQ bus.

The timing diagram 78 of FIGS. 3A and 3B illustrates single data write operation of the memory device 10 in which two columns of data are bursted upon the bus 72 during each read operation.

Figures 4, 4A:
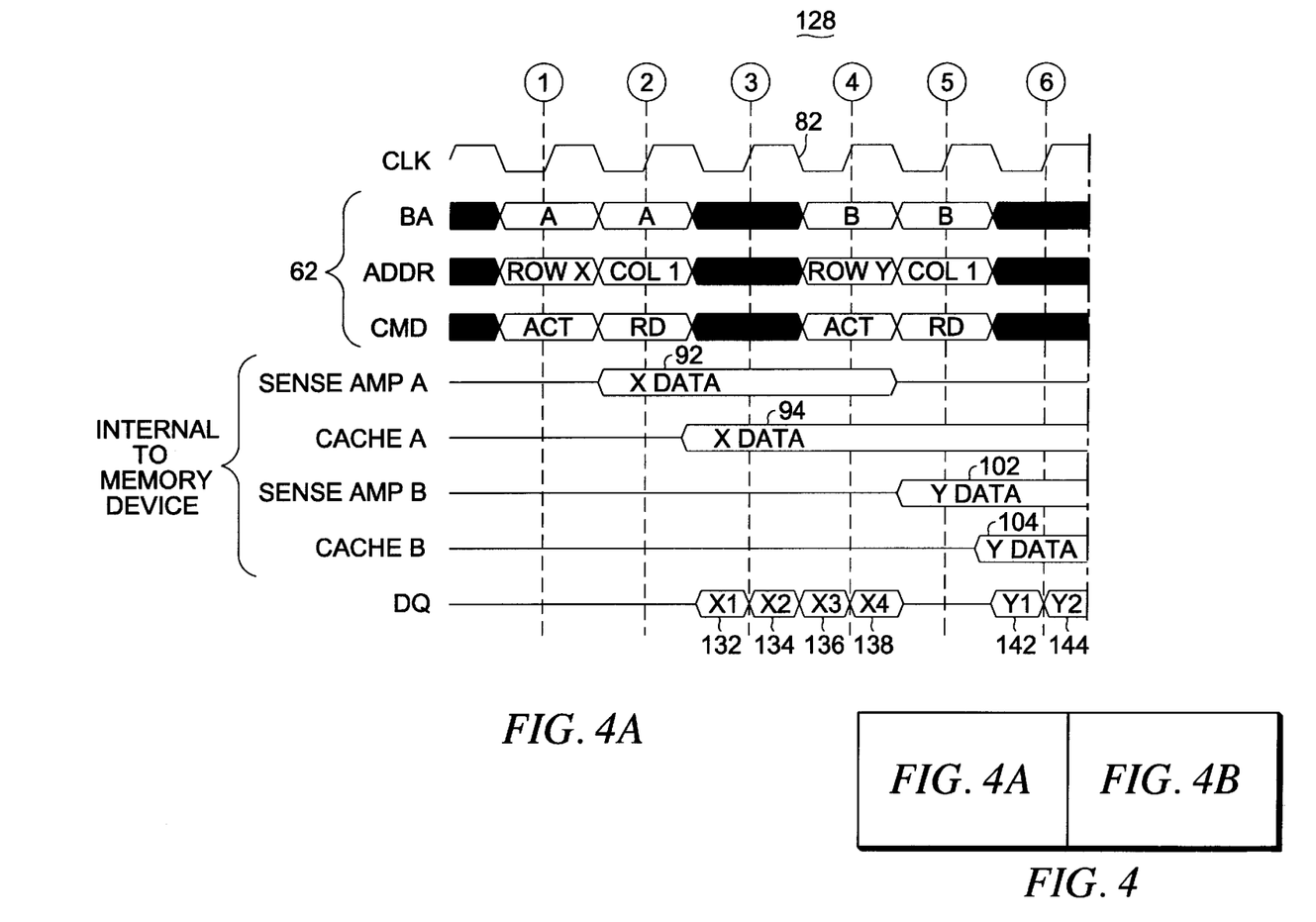
FIGS. 4A and 4B illustrate another timing diagram, similar to that shown in FIGS. 3A and 3B, but here showing a double data rate operation of the memory device.
Figure 4B:
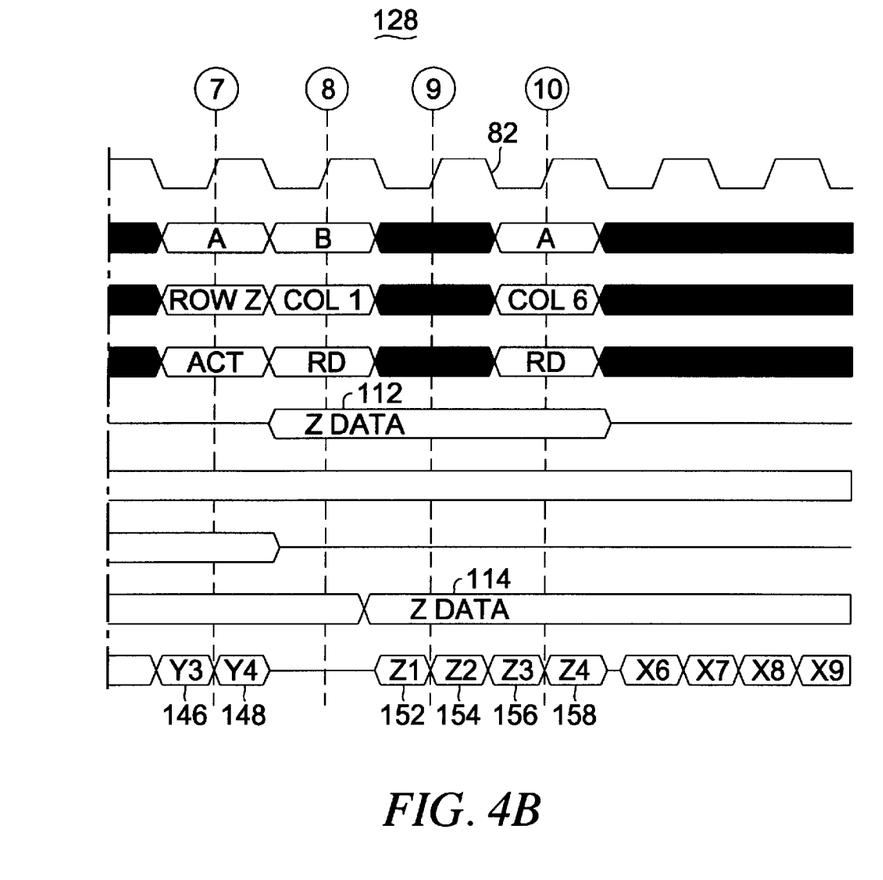

FIGS. 4A and 4B illustrate a timing diagram 128, representative of double data rate operation of the memory device 10. The timing diagram 128 is analogous to that shown in, and described with respect to, FIGS. 3A and 3B, and common reference numerals are illustrated with respect to the timing diagram 128. The timing diagram 128 differs with the timing diagram 78 shown in FIGS. 3A and 3B only in the amount of data caused to be bursted upon the DQ bus. That is to say, twice the amount of data is caused to be bursted on the DQ bus. As illustrated, responsive to caching at the cache register zero at the $x^{th}$ row of data, indicated by the data line 94, four columns, columns 132, 134, 136, and 138 of data are caused to be bursted upon the DQ bus. And, responsive to caching at the cache register one of the write row of data of the DRAM bank B, four columns, columns 142, 144, 146, and 148 of the $y^t$ row are caused to be bursted on the DQ bus. Additionally, responsive to the $z^{th}$ row of data of the DRAM bank A caused to be cached in the cache register one, and as indicated by the data line 114, four columns, 152, 154, 156 and 158 of the $z^{th}$ row of data are caused to be bursted upon the DQ bus.

Figure 5:
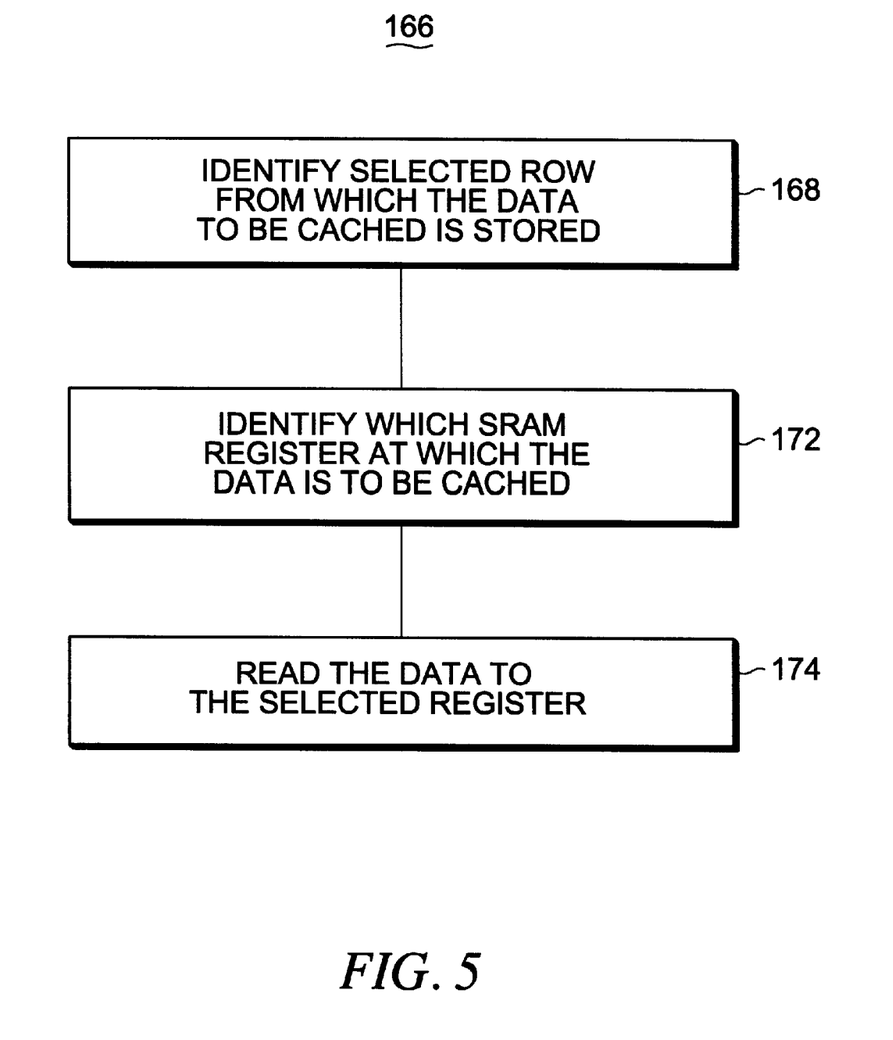
FIG. 5 illustrates a method flow diagram listing the method steps of the method of operation of an embodiment of the present invention.

FIG. 5 illustrates a method, shown generally at 166, of an embodiment of the present invention. The method 166 at least caches data stored in DRAM cells of at least one selected row of at least a first DRAM memory bank. First, and as indicated by the block 168, the selected row from which the data to be cached is stored is identified. Then, and as indicated by the block 172, identification is made of which of a first SRAM register and at least a second SRAM register the data is to be cached. And, as indicated by the block 174, the data is read to the selected one of the first and at least second SRAM register.

Thereby, through execution of a read page operation, data stored at a row of a DRAM bank can be cached at any cache register of a multi-bank DRAM assembly. The method is carried out utilizing an already-existing command set conventionally utilized in existing ESDRAM devices.

The previous descriptions are of preferred examples for implementing the invention, and the scope of the invention should not necessarily be limited to this description. The scope of the present invention is defined by the following claims.

What is claimed is:

1. A memory device for storing indications of digital data therein, said memory device comprising:

a first DRAM (dynamic random access memory) bank formed of rows and columns of DRAM memory locations and defining a first memory array;

a first SRAM (static-random access memory) register associated with the first DRAM bank formed of at least a row of SRAM memory locations capable of caching data of at least a portion of a selected row of the DRAM memory locations of said first DRAM bank responsive to a read command to read the data of the portion of the selected row of the DRAM memory locations of said first DRAM bank to said first SRAM register; and at least a second SRAM (static-random access memory) register not associated with the first DRAM bank, also formed of at least a row of SRAM memory locations and also capable of caching data of at least a portion of a selected row of the DRAM memory locations of said first DRAM bank, the data cached at said second SRAM responsive to a read command to read the data of the portion of the selected row of the DRAM memory locations of said first DRAM bank to said second SRAM register.

2. The memory device of claim 1 further comprising at least a second DRAM bank formed of rows and columns of DRAM memory locations and defining at least a second memory array.

3. The memory device of claim 2 wherein said at least the second DRAM bank comprises a plurality of DRAM banks and wherein said at least second SRAM register comprises a plurality of SRAM registers, said plurality of DRAM banks corresponding in number with said plurality of SRAM registers.

4. The memory device of claim 2 wherein said first SRAM register is further capable of caching data of at least a portion of a selected row of the DRAM memory locations of said at least second DRAM bank responsive to a read command to read the data of the portion of the selected row of the DRAM memory locations of said at least second DRAM bank to said first SRAM register.

5. The memory device of claim 2 wherein said at least second SRAM register is further capable of caching data of at least a portion of a selected row of the DRAM memory locations of said at least second DRAM bank responsive to a read command to read the data of the selected row of the DRAM memory locations of said at least second DRAM bank to said at least second SRAM register.

6. The memory device of claim 2 further comprising an SRAM register bus coupled to said first SRAM register and to said at least second SRAM register, said SRAM-register bus for selectively providing the data to said first SRAM register and to said at least second SRAM register responsive to the read command to read the data of the portion of the selected row of the DRAM memory locations of, selectably, said first DRAM bank and said at least second DRAM bank.

7. The memory device of claim 2 wherein said first DRAM bank and said first SRAM register together form portions of a first ESDRAM (enhanced synchronous dynamic random access memory) and wherein said second DRAM bank and said second SRAM register together form portions of a second ESDRAM.

8. The memory device of claim 7 wherein said first ESDRAM and said second ESDRAM are operable pursuant to a JEDEC-established single data rate.

9. The memory device of claim 7 wherein said first ESDRAM and said second ESDRAM are operable pursuant to a JEDEC-established double data rate.

10. The memory device of claim 1 wherein the read command responsive to which the data is cached at said first SRAM comprises a read page command commanding data to be read from an entire row of the DRAM memory locations of said first DRAM bank.

11. The memory device of claim 1 wherein the read command responsive to which the data is cached at said second SRAM comprises a read page command commanding data to be read from an entire row of the DRAM memory locations of said first DRAM bank.

12. The memory device of claim 1 further comprising an SRAM register bus coupled to said first SRAM register and to said at least second SRAM register, said SRAM-register bus for selectively providing the data to said first SRAM register and to said at least second SRAM register responsive to the read command to read the data of the at least the portion of the selected row of the DRAM memory locations of, selectably, said first DRAM bank and said at least second DRAM bank.

13. A method for caching data stored in DRAM (dynamic random access memory) cells of at least one selected row of at least a first DRAM memory bank, said method comprising:

identifying the selected row of the at least first DRAM memory bank from which the data to be cached is stored;

identifying to which of a first SRAM (static random access memory) register and at least a second SRAM register the data is to be cached; and reading the data to the SRAM register of the first SRAM register and the at least second SRAM register identified during said operation of identifying to which of the first SRAM register and the at least second SRAM register the data is to be cached.

14. The method of claim 13 wherein the at least the first DRAM memory bank comprises a first DRAM memory bank and at least a second DRAM memory bank and wherein said method further comprises:

identifying at which of the first DRAM bank and the at least second DRAM bank the selected row is located from which the data to be cached is stored.

15. The method of claim 14 wherein said operation of identifying at which of the first DRAM bank and the at least second DRAM bank the selected row is located comprises generating a bank identifier, identifying a selected one of the first DRAM bank and the at least second DRAM bank, upon a bank address bus.

16. The method of claim 15 wherein said operation of identifying the selected row at which the data to be cached is stored comprises generating a row address identifier, identifying the selected row, upon data address bus.

17. The method of claim 16 wherein the bank identifier generated upon the bank address bus and the row address identifier generated upon the data address are generated during overlapping time periods.

18. The method of claim 14 wherein said operation of identifying to which register the data is to be cached comprises generating a cache identifier, identifying a selected one of the first SRAM register and the at least second SRAM register, upon the bank address bus.

19. The method of claim 18 wherein said operation of reading comprises the operations of:

generating a read command upon a command bus; and providing indications of the data stored in the selected row to the SRAM register at which the data is to be cached.

20. An integrated circuit memory device comprising:

a first ESDRAM device having a first DRAM memory bank and a first cache memory;

a second ESDRAM device having a second DRAM memory bank and a second cache memory; and a bus coupled between said first ESDRAM device and said second ESDRAM device, said bus for providing data read from at least the first DRAM memory of said first ESDRAM device to a selected one of the first cache memory and the second cache memory.

* * * * *